(12) United States Patent
Basnett et al.

(10) Patent No.: US 12,173,427 B2
(45) Date of Patent: Dec. 24, 2024

(54) METHOD OF GROWING SINGLE CRYSTAL DIAMOND ASSISTED BY POLYCRYSTALLINE DIAMOND GROWTH

(71) Applicant: Plasmability, LLC, Austin, TX (US)

(72) Inventors: Robert J. Basnett, Austin, TX (US); Andrew Francis Basnett, Austin, TX (US); Amanda Charris-Hernandez, Austin, TX (US); William Holber, Winchester, MA (US); Travis Charles Wade, Harvard, MA (US); Adam James Brown, Round Rock, TX (US)

(73) Assignee: Plasmability, LLC, Austin, TX (US)

( * ) Notice: Subject to any disclaimer, the term of this patent is extended or adjusted under 35 U.S.C. 154(b) by 0 days.

(21) Appl. No.: 17/424,081

(22) PCT Filed: Dec. 7, 2020

(86) PCT No.: PCT/US2020/063585
§ 371 (c)(1),
(2) Date: Jul. 19, 2021

(87) PCT Pub. No.: WO2021/118923
PCT Pub. Date: Jun. 17, 2021

(65) Prior Publication Data
US 2022/0119983 A1    Apr. 21, 2022

Related U.S. Application Data

(60) Provisional application No. 62/945,180, filed on Dec. 8, 2019.

(51) Int. Cl.
*C30B 29/04*    (2006.01)
*C30B 25/10*    (2006.01)
(Continued)

(52) U.S. Cl.
CPC ............ *C30B 29/04* (2013.01); *C30B 25/105* (2013.01); *C30B 25/12* (2013.01); *C30B 25/16* (2013.01)

(58) Field of Classification Search
CPC ......... C30B 29/04; C30B 25/16; C30B 25/20; C30B 25/00; C23C 16/27; C01B 32/25
See application file for complete search history.

(56) References Cited

U.S. PATENT DOCUMENTS 9,732,440 B2    8/2017  Asmussen et al.
2011/0280790 A1*  11/2011  Hemley ............... C30B 25/105
                                                 117/103
(Continued)

FOREIGN PATENT DOCUMENTS

CA    3163682 A1    6/2021
CN    109161964 A    1/2019
(Continued)

OTHER PUBLICATIONS

Ren Ze-Yang, et al., Multiple Enlarged Growth of Single Crystal Diamond by MPCVD with PCD-rimless Top Surface, Dec. 5, 2020, Chinese Physics B, 28(12), cpb.iphy.ac.cn/article/2019/2015/cpb_28_12_128103.html#outline_anchor_16.
(Continued)

*Primary Examiner* — Matthew J Song
(74) *Attorney, Agent, or Firm* — Rauschenbach Patent Law Group, PLLC; Kurt Rauschenbach

(57) ABSTRACT

A method of growing single crystal diamond assisted by polycrystalline diamond growth to enhance dimensions and quality of the single crystal diamond includes thermally mating a diamond seed on a top surface of a substrate holder providing a growth surface for a combination of single crystal diamond and polycrystalline diamond. A predetermined temperature difference between the diamond seed and the substrate holder during processing along with the plasma
(Continued)

process conditions causes a single crystal diamond growth rate to be different from a polycrystalline growth rate by a predetermined amount. Process gasses are introduced, and a plasma is formed to grow both single crystal diamond and polycrystalline diamond on the growth surface so that the polycrystalline diamond grown adjacent to the single crystal diamond shields side surfaces of the growing single crystal diamond, thereby improving growth quality across the growing single crystal diamond.

56 Claims, 3 Drawing Sheets

(51) Int. Cl.
  *C30B 25/12* (2006.01)
  *C30B 25/16* (2006.01)

(56) References Cited

U.S. PATENT DOCUMENTS

| | | | | |
|---|---|---|---|---|
| 2012/0302045 | A1* | 11/2012 | Yamada | C30B 25/105 257/E21.09 |
| 2014/0137795 | A1 | 5/2014 | Chang et al. | |
| 2014/0209014 | A1 | 7/2014 | Chang et al. | |
| 2014/0220261 | A1* | 8/2014 | Asmussen | H01J 37/32807 315/39.51 |
| 2014/0332934 | A1 | 11/2014 | Mollart et al. | |
| 2018/0209038 | A1 | 7/2018 | Okahisa et al. | |
| 2018/0266013 | A1* | 9/2018 | Wort | C30B 25/20 |
| 2019/0024236 | A1 | 1/2019 | Tellez Oliva et al. | |
| 2020/0087782 | A1* | 3/2020 | Green | C30B 29/04 |
| 2023/0392283 | A1 | 12/2023 | Basnett et al. | |

FOREIGN PATENT DOCUMENTS

| | | | | |
|---|---|---|---|---|
| CN | 109923247 A | | 6/2019 | |
| CN | 114787430 A | | 7/2022 | |
| KR | 10-2022-0112778 A | | 8/2022 | |
| WO | WO-2005010245 A1 * | | 2/2005 | C30B 23/02 |
| WO | 2017/050620 A1 | | 3/2017 | |
| WO | 2018/087110 A1 | | 5/2018 | |
| WO | WO-2020240459 A1 * | | 12/2020 | C23C 16/274 |
| WO | 2021/118923 A1 | | 6/2021 | |

OTHER PUBLICATIONS

International Search Report and Written Opinion received for PCT Application Serial No. PCT/US2020/063585 dated Apr. 5, 2021, 08 pages.

Butler et al., "Understanding the Chemical Vapor Deposition of Diamond: Recent Progress", Journal of Physics: Condensed Matter, 2009, vol. 21, 3642021, 20 pages.

Silva et al., "Microwave Engineering of Palsma-Assisted CVD Reactors for Diamond Deposition", Journal of Physics: Condensed Matter, 2009, vol. 21, 364202, 16 pages.

International Preliminary Report on Patentability received for PCT Patent Application No. PCT/US2020/063585, dated Jun. 23, 2022, 5 pages.

Office Action received for Canadian Patent Application No. 3,163,682, dated Aug. 29, 2022, 4 pages.

Office Action received for Chinese Patent Application No. 202080084769.X, dated Jan. 12, 2023, 16 pages including 9 pages of English Translation.

Office Action received for Japanese Patent Application No. 2022-534394, dated Oct. 28, 2022, 8 pages including 4 pages of English Translation.

Decision of Refusal received for corresponding Japanese Patent Application No. 2022-534394, mailed on Jun. 9, 2023, 9 pages including 4 pages of English Translation.

Second Office Action received for corresponding Chinese Patent Application No. 202080084769.X, mailed on Jul. 8, 2023, 10 pages including 6 pages of English Translation.

Notice of Allowance received for corresponding Canadian Patent Application No. 3163682, mailed on Jul. 17, 2023, 1 page with English Translation.

Extended European Search Report received for corresponding European Patent Application No. 20898197.7, mailed on Nov. 6, 2023, 11 pages.

Decision on Rejection received for corresponding Chinese Patent Application No. 202080084769.X, mailed on Jan. 2, 2024, 13 pages including 7 pages of English Translation.

Notice of Preliminary Rejection Received for corresponding Korean Patent Application No. 10-2022-7019374, mailed on Jan. 4, 2024, 25 pages including 14 pages of English Translation.

Examination Report Received for European Patent Application No. 20898197.7, mailed on Aug. 20, 2024, 15 pages.

* cited by examiner

METHOD OF GROWING SINGLE CRYSTAL DIAMOND ASSISTED BY POLYCRYSTALLINE DIAMOND GROWTH

CROSS REFERENCE TO RELATED APPLICATION

This application is a U.S. National Stage under 35 USC 371 of International Patent Application Serial Number: PCT/US20/63585, filed on Dec. 7, 2020, entitled "Method of Growing Single Crystal Diamond Assisted by Polycrystalline Diamond Growth" which claims benefit of U.S. Provisional Patent Application Ser. No. 62/945,180 filed on Dec. 8, 2019, entitled "Lateral Enlargement for Single Crystal Diamond Growth Using Plasma Chemical Vapor Deposition". The entire contents of International Patent Application Serial Number PCT/US20/63585 and U.S. Provisional Patent Application Ser. No. 62/945,180 are all herein incorporated by reference.

INTRODUCTION

The market for synthetic diamond is growing rapidly. This is due, at least in part, to the many desirable material properties of diamond, such as excellent hardness, chemical stability, low-thermal expansion, high thermal conductivity, wide electronic bandgap and broad optical transmission. Grown diamond material is currently used in numerous and a growing number of applications including, for example, abrasives, electronics, optics, experimental physics, and gems. The increasing demand for grown diamond drives the need for improved apparatus and methods that can efficiently produce high-quality, large-size single-crystal diamonds.

BRIEF DESCRIPTION OF THE DRAWINGS

The present teaching, in accordance with preferred and exemplary embodiments, together with further advantages thereof, is more particularly described in the following detailed description, taken in conjunction with the accompanying drawings. The person skilled in the art will understand that the drawings, described below, are for illustration purposes only. The drawings are not necessarily to scale, emphasis instead generally being placed upon illustrating principles of the teaching. The drawings are not intended to limit the scope of the Applicants' teaching in any way.

DESCRIPTION OF VARIOUS EMBODIMENTS

Figure 1:
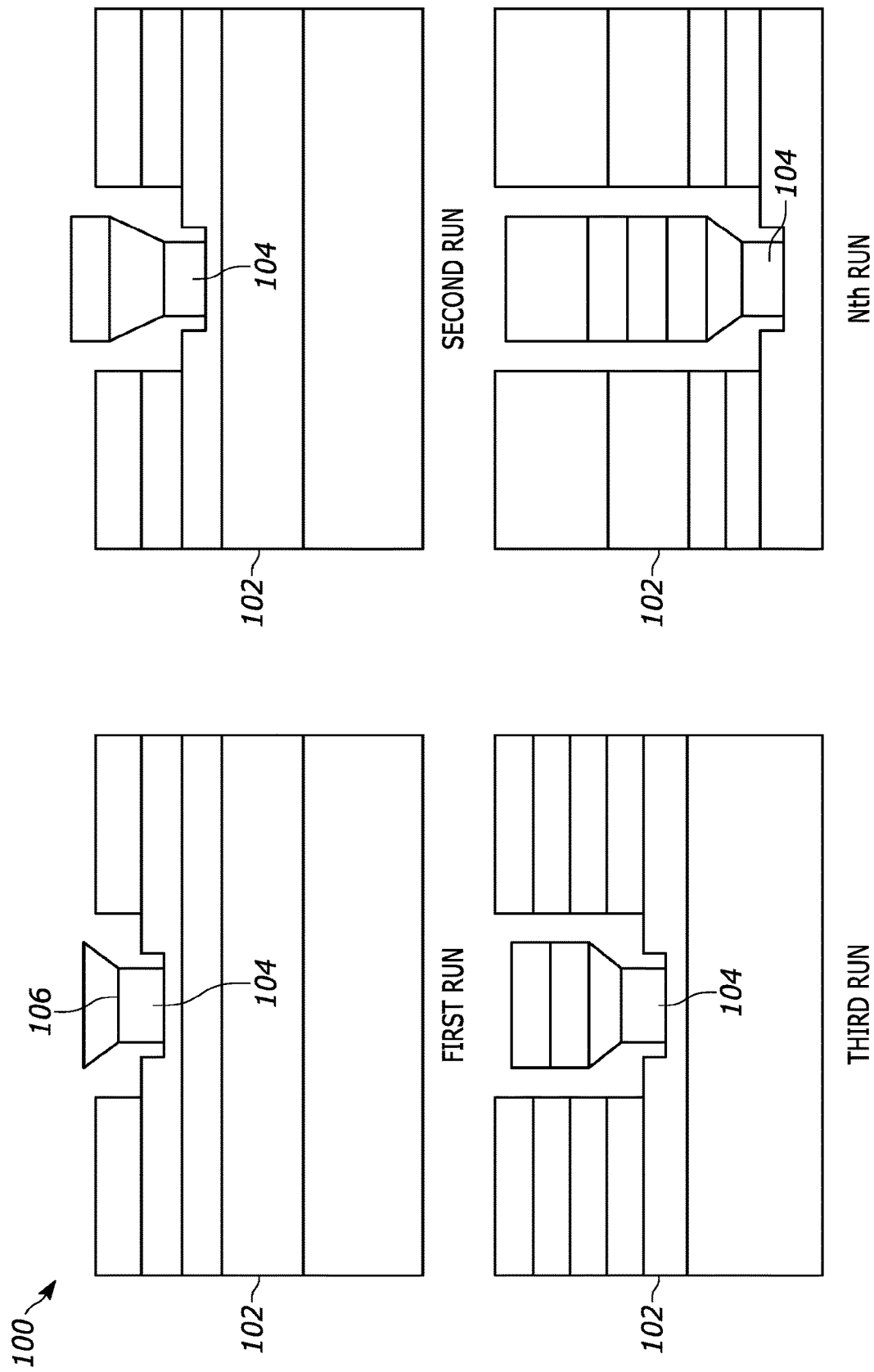
FIG. 1 illustrates a sequence of growth runs using a known single crystal diamond growth substrate holder assembly.

The present teaching will now be described in more detail with reference to exemplary embodiments thereof, as shown in the accompanying drawings. While the present teaching is described in conjunction with various embodiments and examples, it is not intended that the present teaching be limited to such embodiments. On the contrary, the present teaching encompasses various alternatives, modifications, and equivalents, as will be appreciated by those of skill in the art. Those of ordinary skill in the art having access to the teaching herein will recognize additional implementations, modifications, and embodiments, as well as other fields of use, which are within the scope of the present disclosure as described herein.

It should be understood that the individual steps of the methods of the present teaching may be performed in any order and/or simultaneously as long as the teaching remains operable. Furthermore, it should be understood that the apparatus and methods of the present teaching can include any number or all of the described embodiments as long as the teaching remains operable.

The present teaching relates to growth of single crystal diamond. Synthetic diamond materials have been produced for many years by a variety of means. Early synthetic diamond processing techniques used thermal torches and high pressure, high temperature reactors. Beginning in the 1980's, investigators began looking at plasma chemical vapor deposition (CVD) techniques to form synthetic diamond films. The deposited films were typically thin or thick films of diamond material that were deposited onto substrates such as silicon, tungsten, and molybdenum. Much of the initial development of plasma CVD diamond deposition has been performed using microwave-based reactors operating in the general pressure range of 10-300 Torr. More recently, some diamond deposition has been performed using lower pressure plasma reactors and non-microwave generators. In general, higher-quality films and higher deposition rates have been obtained using the higher-pressure microwave systems. See, for example, J. E. Butler, Y. A. Mankelevich, A. Cheesman, Jie Ma and M. N. R. Ashfold, "Understanding the Chemical Vapor Deposition of Diamond: Recent Progress", Journal of Physics: Condensed Matter 21 (2009) 364201, IOP Publishing. See also, F. Silva, K. Hassouni, X. Bonnin and A. Gicquel, "Microwave Engineering of Plasma-Assisted CVD Reactors for Diamond Deposition," Journal of Physics: Condensed Matter 21 (2009) 364202, IOP Publishing. All the references cited herein, including J. E. Butler et al., and F. Silva et al., are herein incorporated by reference.

The plasma chemistry for depositing diamond, diamond-like carbon, graphene, and related materials includes mainly hydrogen chemistry with the addition of a small amount of a carbon-containing gas, such as methane or acetylene. Other gases can be added as well. For example, other gases containing carbon and hydrogen can be used. In addition, other gases can be added such as nitrogen, oxygen, argon and/or a halogen species. Gases containing one or more dopant material, such as boron, can also be added in combination with other gases. The plasma dissociates some fraction of the hydrogen as well as the carbon-containing species. Atomic hydrogen is a critical ingredient because it adsorbs onto the growing diamond surface and also preferentially etches away non-diamond carbon-bonds in favor of diamond bonds. One key to both high deposition rates and high-quality film growth is to have a high flux of atomic hydrogen at the workpiece surface, which favors the use of a plasma system as opposed to, for example, a hot-filament system.

Single crystal diamond material is generally grown on a starting substrate that is itself single crystal diamond. Single crystal diamond material is also grown on non-single crystal diamond substrates, such as iridium. For growth of polycrystalline diamond material, there is a wide choice of substrates including silicon, molybdenum, tungsten, and many other materials.

The starting substrate is typically at a temperature that is in the range of 600-1400 degrees C. during growth. In order to achieve a high-rate growth of high-quality diamond material, it is necessary that the plasma discharge be of sufficient intensity such that the gas in the core of the plasma discharge is heated to greater than 2000 degrees C. This high gas temperature is necessary in order to maintain a high degree of dissociation of the hydrogen gas into atomic hydrogen, which is critical to the growth of high-quality material at high rates. Example working conditions that will generate these high gas temperatures are typically total gas pressure greater than 20 Torr and power delivered into the plasma core at a density of greater than 50 W cm$^{-3}$. For preferred high deposition rates, the power delivered into the plasma core may exceed 100 W cm$^{-3}$ and pressures may exceed 100 Torr, resulting in a gas temperature in the plasma core that may exceed 2000 degrees C. and even exceed 3000 degrees C. in some processes.

The plasma discharge may be generated in several different ways. Traditionally, microwave power sources, typically at either 2.45 GH or 915 MHz frequencies, have been used at power levels as low as 1 kW to greater than 100 kW. Theses microwave frequencies are attractive because the energy travels in a wave and the construction of the process chamber can allow the discharge to be centered near the substrate where the deposition occurs, and away from the process chamber walls. The particular microwave frequency may be higher or lower than these values, but these are typically used because they are reserved for industrial applications by international agreement and components are widely available in the commercial market.

More recently, other frequencies for the power source and other techniques for coupling the power to the plasma discharge have been developed. One example is a toroidal plasma discharge in which radio frequency (RF) power at 400 kHz is inductively coupled through a transformer structure into a closed-loop discharge. Other RF frequencies may be utilized to form the toroidal discharge as well, from as low as 20 kHz to over 14 MHz. Another example is that of using a direct current (DC) discharge as the plasma source in a CVD diamond system.

One enabling technology for CVD diamond deposition is the starting single crystal diamond substrate that provides the platform for growth of the diamond material. For some applications it is desirable to grow single crystal diamond material in a direction parallel to the initial growth surface, as well as perpendicular to it. By parallel to the initial growth surface, we mean lateral to or on the side of the initial growth surface. This will allow the initial diamond 'seed' to be expanded in both the perpendicular and parallel dimensions relative to the initial seed surface. The applications where this would be beneficial include, for example: generating substrates for electronic devices and sensors; providing windows for various vacuum applications; manufacturing materials for use in optics; manufacturing lab-grown diamond gems; and generating diamond materials for industrial applications such as cutting tools.

For some applications, it is desirable to grow thick single crystal diamond material, in a direction that is predominately perpendicular to the initial seed surface. Some applications where this would be beneficial include, for example: generating substrates for electronic devices and sensors; providing windows for various vacuum applications; manufacturing materials for use in optics; manufacturing lab-grown diamond gems; and generating diamond materials for industrial applications, such as cutting tools.

Known methods for growing large area substrates include, for example, placing multiple seeds together and overlapping the growth. These known methods typically result in visible and mechanical defects that make the substrate undesirable for some applications.

Known methods for growing large area substrates include, for example, using a single large seed cut from a natural diamond. These known methods, however, are typically very expensive and time-consuming to perform.

It is known in the art that without lateral growth of diamond material using chemical vapor deposition, the mass of the finished diamond gem in grams cut from the chemical vapor deposition grown diamond cannot exceed a maximum possible mass in grams that can be determined by the expression M=0.002*A**1.5, where A is the area of the seed in millimeters squared. See, for example, Charles I. Carmona, Estimating Weights of Mounted Colored Gemstones, Gems and Gemology, Fall 1998. The present teaching relates, at least in part, to a diamond substrate apparatus and growth method that promote the growth of the material both perpendicular to the growth face and parallel or lateral to the growth face. However, it has been determined that with the lateral growth methods according to the present teaching, there is no limit on the mass of the finished gem with respect to the area of the seed. This allows for optimizing the packing and cost of the initial diamond seeds and will enable growth of gems from chemical vapor deposition grown diamond material larger than would be possible by known methods. Thus, in contrast to known apparatus and methods for single crystal diamond growth, the present teaching allows the deposition of large, single crystal diamond pieces using either single or multiple growth cycles.

One feature of the present teaching is that diamond material quality can be improved by using only a single, or a few growth cycles, in contrast to using many growth cycles. The reduced number of growth cycles according to the present teaching can eliminate or greatly reduce growth lines or other defects that can occur due to stopping and starting the growth process or that can occur by significantly modifying the growth process parameters during the growth. Stopping and starting the growth process or significantly changing process parameters, such as pressure, power, chemistry or sample temperature can result in such growth lines or other defects, which may be visible by eye or under optical magnification or by other analytical instrumentation. Using a single, or a few growth cycles, also maximizes reactor utility and minimizes cost, allowing for overall savings in production costs.

Another feature of the method and apparatus of the present teaching is that by varying process parameters and/or hardware related to mounting the samples, the apparatus and method of the present teaching can be used to reliably control the growth in the direction parallel (lateral) to the growing seed face. In some embodiments, for every millimeter of growth perpendicular to the initial seed face, the growth parallel (lateral) to the initial seed face is varied from 0 mm to approximately 2 mm. At the extreme, this is a ratio of parallel-to-perpendicular growth of 2.2:1. With additional optimizations, the apparatus and method can further extend the ratio of parallel-to-perpendicular growth to a greater value such as 2.5:1 and even 3:1.

FIG. 1 illustrates a sequence of growth runs 100 using a known single crystal diamond growth substrate holder assembly 102. See, for example, U.S. Pat. No. 9,732,440. The growing sample 104 is placed in the holder assembly 102. The holder assembly 102 is used both to enlarge the growing single crystal diamond material parallel to the initial seed face 106 of the growing sample 104 and to increase the size of the material perpendicular to the initial seed face 106. The holder assembly 100 is typically made of molybdenum or another high-temperature material so that it shields the outer edges of the sample 104 from the plasma discharge chemistry, thus limiting the growth of undesirable polycrystalline diamond material at the edges.

In each successive run in the sequence of growth runs 100 of the method of FIG. 1, additional shielding material is added to the holder assembly 102, allowing the growing shape of the sample 104 to be maintained. However, this requires that each time the process is halted, the sample 104 is removed, optionally trimmed and polished, and the holder assembly 102 is modified. The sample 104 then needs to be reloaded and the process restarted. Using this technique, enlargement of the area of the diamond of over two times relative to the starting seed area has been demonstrated. Thus, this technique can provide up to approximately a 2:1 ratio of parallel to perpendicular growth.

However, a significant drawback of this known approach is that in order to generate enlargements of the area, the growth steps need to be repeated multiple times, using different sized holders. In addition, processing of the material between steps is typically required that may include steps such as laser trimming followed by one or more polishing steps. These additional steps significant add to the processing time and cost as well as increase the probability of damaging the sample 104. As an alternative to changing holders within a process chamber, the user may have multiple chambers and move the sample from chamber-to-chamber in sequence, where each chamber has a holder optimized for a particular process step.

Another feature of the present teaching is that there is no requirement to use substrate holders that must be periodically changed. However, periodically changing substrate holders can still be used advantageously in the same way as used in known methods. In particular, it should be understood that some embodiments of methods and apparatus of the present teaching provide a larger ratio of parallel-to-perpendicular growth without the need to change holders. Also, it should be understood that some embodiments of methods and apparatus of the present teaching can include some aspect of changing holders to further increase growth improving the economics of the process. Performing multiple holder changes during a growth process may be done, for example, if particularly large grown diamond samples are desired.

In some embodiments of methods of the present teaching, the growth process is improved or optimized to achieve process goals other than achieving a larger ratio of parallel-to-perpendicular growth. For example, in some methods, it is desirable to improve or maximize packing of seeds rather than improve or optimize an increase in physical size in at least one dimension of individual growths. In such methods, the desired parallel growth can be at or near zero.

In some embodiments of the present teaching, single crystal diamond seeds are thermally attached to a substrate holder, which can have a surface that is flat or textured or a surface that has features assisting mounting of the starting seeds. Also, in some embodiments, single crystal diamond seeds are thermally attached to a substrate holder with a high thermal conductivity material or a low thermal conductivity material and/or a material with a similar coefficient of thermal expansion to the coefficient of thermal expansion of the single crystal material. Various methods according to the present teaching use substrate holder material along with bonding materials to more closely match coefficients of thermal conductivity.

In some embodiments, during processing the holder is at a temperature less than the diamond seed. The holder may be constructed of a number of different materials including, for example, molybdenum, tungsten, silicon, high-temperature ceramics, and other materials.

The holder must be able to support the growth of polycrystalline diamond material at an average growth rate such that the polycrystalline material does not overwhelm the single crystal samples, but great enough to assist the growth of the single crystal material. That is, the geometry and temperature of the holder and the plasma conditions are configured such that polycrystalline material that accumulates in the regions that are not occupied by the seed does not significantly grow up to or beyond the single crystal diamond. The simultaneous growth of both polycrystalline material and single crystal material will allow the polycrystalline material to assist keeping the temperature of the growing single crystal diamond material at a desired value. In addition, the system advantageously limits the growth of undesirable polycrystalline material on the edges of the single crystal samples.

In some methods according to the present teaching, a non-diamond layer of carbon material is formed between the single crystal growth and the polycrystalline growth. Such layers can be formed during part or all of the growth cycle. This may assist in reducing the stress that might otherwise be introduced into the growing single crystal material by the polycrystalline material.

Figure 2:
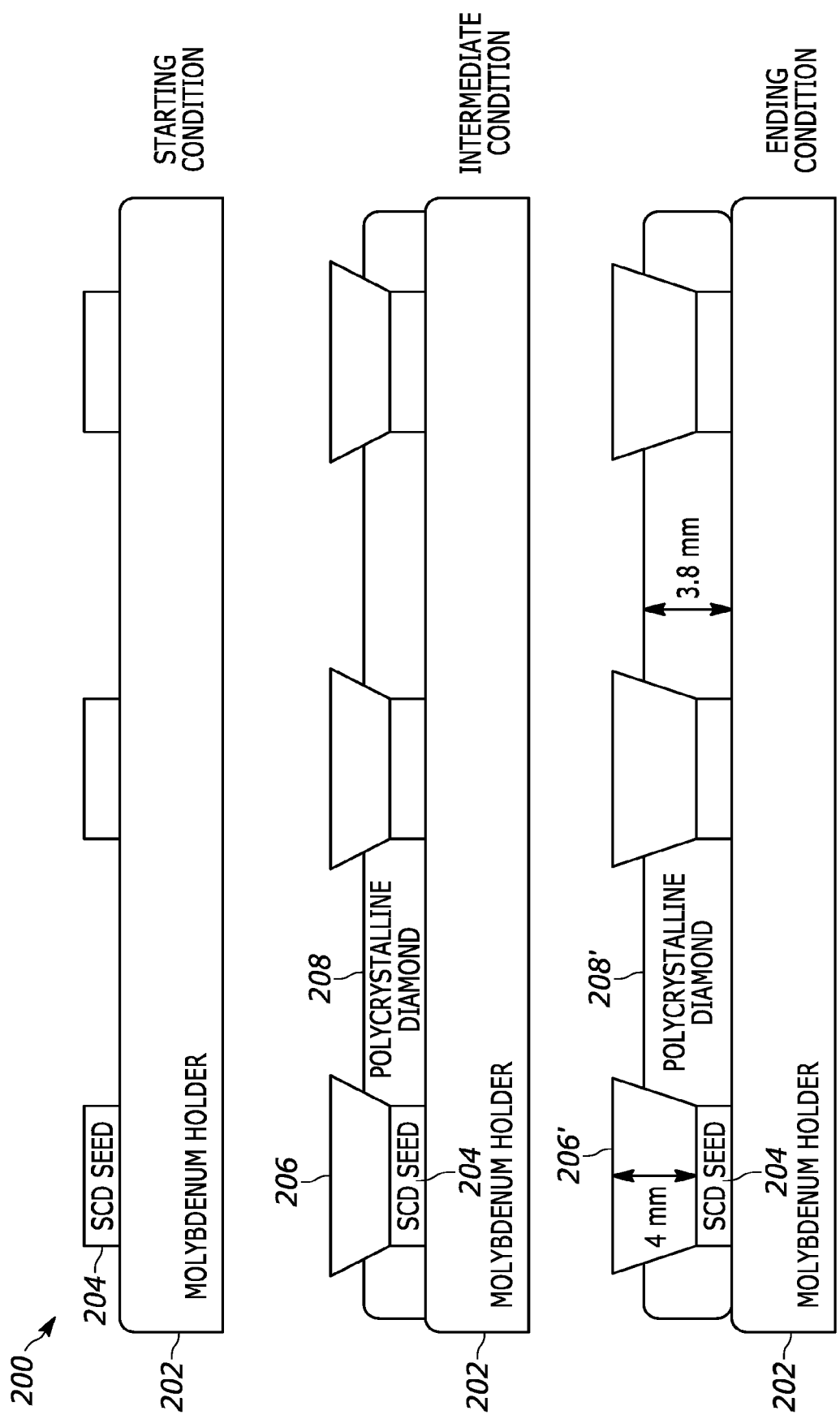
FIG. 2 illustrates cross-sections of grown diamond on a substrate holder for an embodiment of a sequence of growth steps in an apparatus and method of single crystal diamond growth of the present teaching.

FIG. 2 illustrates cross-sections 200 of grown diamond on a substrate holder 202 for an embodiment of a sequence of growth steps in an apparatus and method of single crystal diamond growth of the present teaching. The configuration of the holder 202 and seed 204 support an increase the surface area of CVD-grown diamond samples 206, 206'. A single-crystal diamond (SCD) sample shown in the figure is the starting seed 204 for the growth. The thicknesses shown in FIG. 2 are just one example of a growth cycle that has been achieved. The schematic cross-sections are not to scale.

As can be seen from FIG. 2, a necessary part of the present teaching is that the growth of the polycrystalline diamond material on the sample holder 202 (shown as molybdenum for this example) must be close to, but not greatly exceeding, the growth of the single crystal diamond in the direction perpendicular to the initial seed. It should be understood that the growth rate of the polycrystalline diamond material can be higher than the growth rate of the single crystal material at a particular point in time, as long as the total growth of the polycrystalline diamond material does not significantly exceed the total growth on the single crystal growth surface during the majority of the growth process. During a later portion of the growth process, the polycrystalline diamond material can overgrow the single crystal material. The relative growth rates of the single crystal material and the polycrystalline material 208, 208' are controlled by at least one of temperature of the sample exposed to the plasma, temperature of the sample holder, and process chemistry. Also, the starting condition of the sample holder 202 will impact the rate at which the polycrystalline growth begins. This starting condition can, for example, be used to give the growth of a single crystal material a 'head-start'. In this way, even if the growth rates of the polycrystalline material 208, 208' and CVD-grown diamond samples 206, 206' are similar, the single crystal growth will always be thicker than the polycrystalline growth, which may be desirable. Use of a thicker starting seed 204 of the single crystal diamond material or use of an additional element to elevate the starting seed further above the sample holder 202 will also provide a 'head-start' for the single crystal growth. The elevated seed embodiment is not illustrated in FIG. 2.

The temperature difference between the single crystal CVD-grown diamond samples 206, 206' and the molybdenum holder 202, 304 can be controlled by how the single crystal material, seed 204, is thermally mated to the holder, as well as the power density incidence on the single crystal sample seed 204 from the plasma discharge chemistry. In one method, the seed 204 is placed on the surface of the holder 202, which may be textured to give a specific thermal transfer characteristic. A finer texture (including polished surface) for the holder 202 will generally give better thermal transfer between the single crystal diamond seed 204 and the holder 202. For example, the surface of the holder 202 can be machined to a finish in the range of 1 to 1000 microinch radius. The surface of holder 202 can be machined by diamond turning and/or polished to a finish of 0.2 microinch radius. In one embodiment, a finish on the surface holder of about 2-100 microinch radius is employed.

A roughened surface for the holder will generally give reduced thermal transfer which can be advantageously used in some processes. In some embodiments, the surface of holder 202 is constructed with recesses for the seeds 204, which will increase the thermal contact between the seeds 204 and the holder 202.

In some embodiments, the surface of holder 202 is constructed with pillars or other elevating structures for the seeds 204, which will increase the 'head-start' for the single-crystal growth relative to the polycrystalline growth. One or more surfaces of the holder may be constructed with texturing, pillars or other structures, cooling channels, recesses, etc.

Some embodiments of the methods and apparatus of present teaching vary the temperature difference between the single crystal diamond samples and the holder by bonding the single crystal seed samples to the holder. In these embodiments, the bonding material must be able to withstand the temperature of the growing material as well as the temperature differential between the growing material and the holder. Examples of bonding materials include metallic brazing materials, which will have high thermal conductivity, and other bonding materials containing fillers such as aluminum oxide, diamond, other oxides, nitrides, metals and carbon. Varying the thickness of the bonding material as well as its composition will impact the temperature difference and differences in thermal expansion coefficients. Bonding the single crystal seed samples to the holder will assist in maintaining consistent thermal contact throughout the duration of the process run and will also assist in preventing the single crystal seed samples from moving.

Some embodiments of the methods of present teaching vary the temperature difference between the single crystal diamond sample seeds and the holder by using an intermediate spacer element between the single crystal diamond sample seed and the holder. This intermediate spacer element adds an additional temperature difference between holder and seed.

Figure 3:
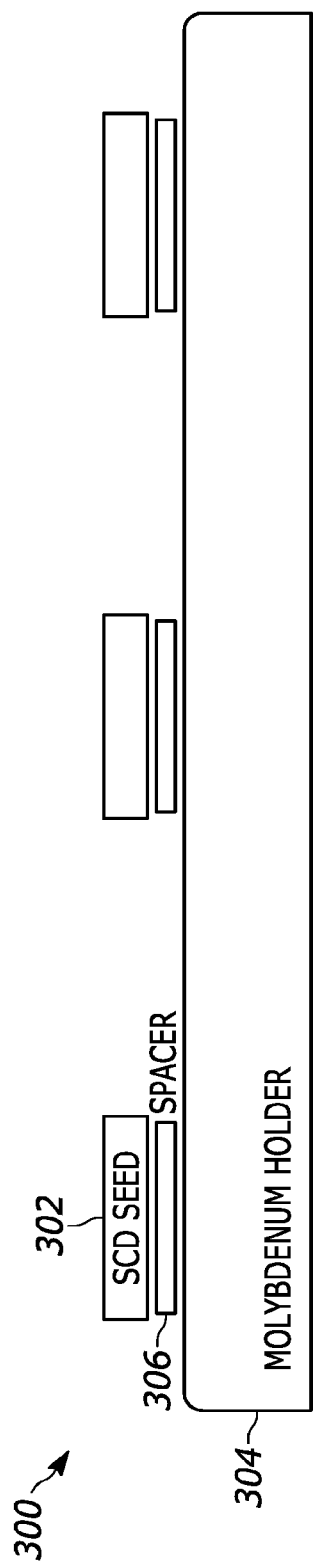
FIG. 3 illustrates a cross-section of seed diamonds mounted on a substrate holder using a spacer in an embodiment of an apparatus and method of single crystal diamond growth of the present teaching.

FIG. 3 illustrates a cross-section 300 of seed diamonds 302 mounted on a substrate holder 304 using a spacer 306 in an embodiment of an apparatus and method of single crystal diamond growth of the present teaching. It should be understood that the cross section 300 is not to scale, but rather is presented to illustrate the present teaching. One aspect of this apparatus and method that uses a spacer 306 is that it has the effect of giving the growth of a single crystal sample an additional 'head-start' over the polycrystalline diamond growth. Another aspect of this apparatus and method that uses a spacer 306 is that it has the effect of increasing the temperature difference between the sample and the holder.

The volume and thickness of the spacer 306 as well as the material forming the spacer 306 are chosen to provide a desired temperature difference between the single crystal diamond sample and the sample holder. As such, this means that the single crystal sample has an additional 'head-start' over the polycrystalline growth as well as potentially higher growth rates and improved growth metrics and characteristics.

While the height of the single crystal diamond material is generally higher than the height of the polycrystalline material for most of the growth cycle, it is possible in some growth processes that the polycrystalline material height can exceed the height of the single crystal sample near the latter part of the growth cycle. It is also possible that the polycrystalline material can overgrow the surface of the single crystal material in the latter part of the growth cycle. While this will limit the growth of the single crystal material, it will not necessarily damage the material or prevent its use.

As the polycrystalline material grows in conjunction with the single crystal growth, it will tend to equalize the temperature among the multiple single crystal growths as well as between the multiple single crystal growths and the sample holder. The polycrystalline growth rate may then increase over time as its temperature increases. Changing the process conditions over time can help to maintain the relative growth rates of the single crystal and polycrystalline material at an optimum value.

One feature of single crystal diamond growth methods according to the present teaching is that they can be used to grow particular crystal faces on a single crystal sample at different rates relative to other crystal faces and that these differential rates can be accurately and repeatably controlled by the process engineer. For example, the methods and apparatus of the present teaching can be used to achieve lateral enlargement of the upper (100) face. As an example of this feature, consider the case of a starting seed that has (100) oriented crystal faces. By carefully selecting various process parameters, for example, sample temperature at the growth surface, pressure in the process chamber, plasma power, sample holder dimensions and configuration, and the various process gas flow rates, the growth rate of the crystal faces (110), (111), (113), relative to the (100) face, can be accurately and repeatably controlled. Process parameters and the sample holder dimensions and configuration can also be selected in order to limit the development of stress in the material.

The growth rates of (100), (110), (111) and (113) crystal faces are dependent on temperature as well as concentration of the various reactive gas species. In some methods according to the present teaching, the growth strategy is to control the concentration of radical species over the growing surfaces as well as the temperature. Such methods obtain a high, uniform growth rate of single crystal diamond material without the growth of polycrystalline diamond material on the edges of the growing sample due to shielding provided by the laterally positioned polycrystalline diamond material. To achieve these, the temperature and the process chemistry can also be varied during the growth cycle as necessary.

The methods and apparatus of the present teaching can be used to fabricate plates of single crystal diamond material that have parallel dimension significantly greater than the corresponding parallel dimensions of the starting seed material. There are numerous applications for such plates, including substrates for gem growth, electronics, sensors, quantum devices, windows for vacuum systems and numerous other applications, optics, and various industrial applications including cutting tools.

The methods and apparatus of the present teaching can be used to fabricate thick plates of single crystal material, with no or insignificant growth in the parallel dimension relative to the starting seed material. There are numerous applications for such plates, including substrates for gem growth, electronics, sensors, quantum devices, windows for vacuum systems and numerous other applications, optics, and various industrial applications including cutting tools.

Figure 4:
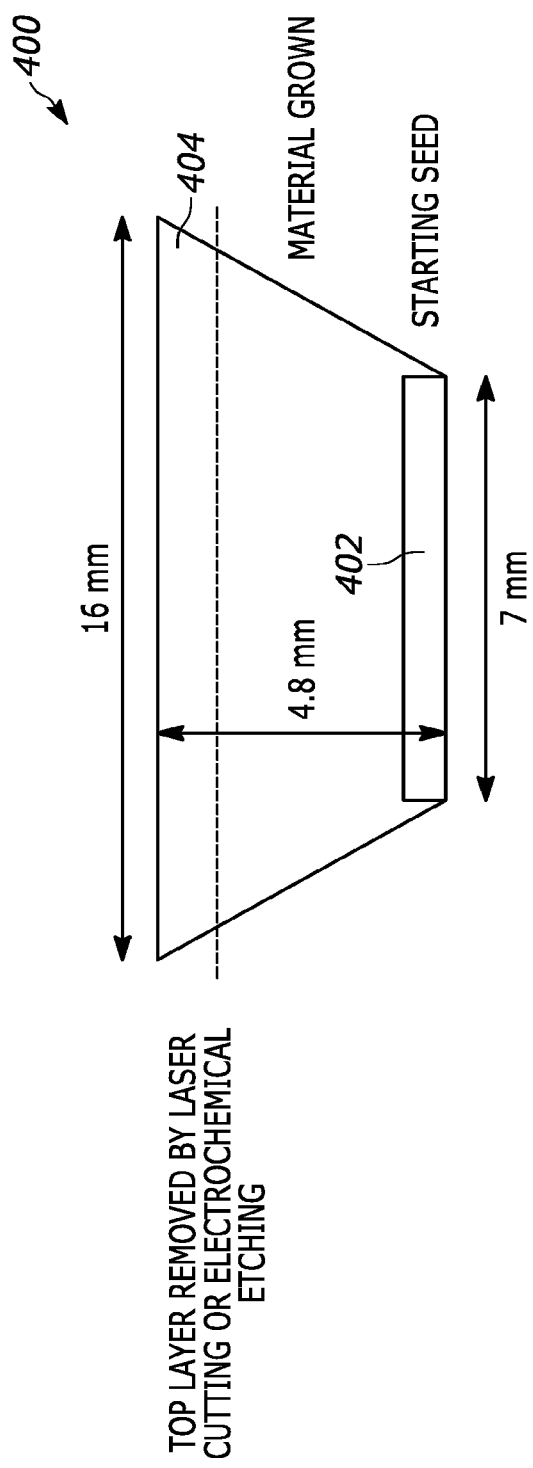
FIG. 4 illustrates a cross-section of grown diamond used to create a plate of single crystal diamond material having larger dimensions than a seed material using an embodiment of an apparatus and method of single crystal diamond growth of the present teaching.

FIG. 4 illustrates a cross-section 400 of grown diamond used to create a plate of single crystal diamond material having larger dimensions than a seed material using an embodiment of an apparatus and method of single crystal diamond growth of the present teaching. A starting seed 402 of single crystal material is grown such that it increases in dimensions both parallel to the starting surface and perpendicular to it. In some methods according to the present teaching, the diamond material grows such that the dimension parallel to the initial growth face is a factor of 1.5-3 times the growth of the dimension perpendicular to the initial growth face. In one method, the material grows such that the dimension parallel to the initial growth face is increased by a factor of approximately two times the rate of growth of the dimension perpendicular to the initial growth face. Also, some methods according to the present teaching produce plates of single crystal diamond material that have a dimension parallel to the initial growth face greater than that of the starting seed.

In some methods, the resulting single crystal diamond material has a mass of greater than 1 gram. In other methods, the resulting single crystal diamond material has a mass of greater than 2 grams. In yet other methods, the resulting single crystal diamond material has a mass of greater than 5 grams. It has been experimentally determined that there is no inherent upper limit on the growth of the single crystal diamond material using methods according to the present teaching, other than the spacing between the growing surface of the diamond material and the plasma and the spacing between multiple samples. In some methods, the substrate holder is retracted during the growth process in order to keep the growing surface at an ideal location.

Also, in some methods according to the present teaching, the thickness of the single crystal diamond growth that can be achieved in a single, continuous growth cycle can exceed 6 mm. In other methods, the thickness of the single crystal diamond growth that can be achieved in a single continuous growth cycle can exceed 10 mm. In yet other methods, the thickness of the single crystal diamond growth that can be achieved in a single, continuous growth cycle can exceed 15 mm. It should be understood that there is no specific upper limit on the thickness of the growth that can be achieved in a single continuous growth cycle.

As a particular example of one reduction to practice, the seed 402 had initial dimensions of approximately 7×7 mm in area and 0.3 mm thickness and was grown to a thickness of 4.5 mm with a lateral dimension of approximately 16 mm as shown in FIG. 4. It should be understood that the plate 404 can be thicker or thinner than the example illustrated in FIG. 4, depending on the particular application. It should be understood that the particular example illustrated in FIG. 4 is not to scale.

The plate 404 is removed from the grown single crystal diamond after growth. Some optional examples of post growth steps are to cut the plate 404 using a laser or other suitable cutting device into thin sections, such as 1-mm-thick sections. One skilled in the art will appreciate that the plate thickness can be larger or smaller than 1 mm. Alternatively, electrochemical etching can be used to cut sections of the plate 404. Alternatively, strain induced by an implanted layer can be used to separate sections of the plate 404 from the main growth.

The plate 404 can be used as a seed for further growth into larger dimensions. Multiple sections can be removed from a single growth to generate multiple plates. Each section may form a plate having an area equal to or smaller than the prior plate. The plate 404 can also be used for various applications, including, for example, electronics, optics, sensors, gems and cutting tool applications.

In some methods according to the present teaching, the process and mounting conditions of the seed is adjusted so that plate 404 grows with little or no growth in the direction parallel (lateral) to the seed surface. In these methods, sections may still be cut out of the plate 404 for various applications.

Single-crystal diamond can be grown according to the present teaching utilizing a plasma processing apparatus that includes a vacuum chamber with gas injection, pumping, and pressure control. A microwave, DC or RF generator creates a plasma in order to grow the single-crystal diamond material. A holder for a diamond sample seed is typically used. The holder is configured such that it can support the growth of polycrystalline diamond material. In some embodiments, a molybdenum holder is used. The diamond seed may be thermally attached to the holder with a thermal bonding material that can be chosen based on its thermal and mechanical properties. The diamond seed may also be placed on the surface of the holder without the use of a thermal bonding material.

In some instances, it may be desirable to complete the growth in one direction perpendicular to a seed face, remove the sample from the CVD system, flip the sample over so that the growth surface is now facing the holder, and resume the growth on the seed side that was formerly facing the holder. This will allow the perpendicular growth to be increased without increasing the maximum growth parallel (lateral) to the seed face. It may be desirable in some instances to clean or trim the grown material before resuming the growth. It may also be desirable in some instances to clean the holder and the process chamber before resuming the growth.

EQUIVALENTS

While the Applicants' teaching is described in conjunction with various embodiments, it is not intended that the Applicants' teaching be limited to such embodiments. On the contrary, the Applicants' teaching encompasses various alternatives, modifications, and equivalents, as will be appreciated by those of skill in the art, which may be made therein without departing from the spirit and scope of the teaching.

What is claimed is:

1. A method of growing single crystal diamond assisted by polycrystalline diamond in a single continuous chemical vapor deposition growth cycle, the method comprising:

a) thermally mating single crystal diamond seeds on a flat top substrate holder directly with a bonding material comprising carbon so as to provide a growth surface of a combined single crystal diamond and polycrystalline diamond substrate that is unrestricted by the substrate holder where there is a predetermined temperature difference determined at least in part by the bonding material comprising carbon between the single crystal diamond seed and the substrate holder during processing which causes a single crystal diamond growth rate in a direction perpendicular to a top surface of the single crystal diamond seed to be different from a polycrystalline growth rate in a direction perpendicular to the top surface of the single crystal diamond seed by a desired amount;

b) providing process gasses and forming a plasma to grow both single crystal diamond and polycrystalline diamond on the growth surface, where the polycrystalline diamond grown adjacent to the single crystal diamond shields lateral surfaces of the growing single crystal diamond from the plasma and process gases, thereby improving thermal uniformity across the growing single crystal diamond during the single chemical vapor deposition growth; and c) terminating the chemical vapor deposition growth of the single crystal diamond without multiple growth cycles, thereby forming a diamond without growth lines and defects associated with multiple growth cycles, while allowing lateral growth with respect to a growth face of the diamond seed that is unrestricted by the substrate holder in a single process run.

2. The method of claim 1 further comprising providing a spacer between the diamond seed and the substrate holder that adjusts a height of the diamond seed relative to the top surface of the substrate holder to change a growth rate of the diamond seed in the direction perpendicular to the top surface of the diamond seed relative to the growth rate of the polycrystalline diamond in the direction perpendicular to the top surface of the diamond seed.

3. The method of claim 1 wherein providing the process gasses and forming the plasma are provided so that there is a temperature difference over the growth surface of the combined single crystal diamond and polycrystalline diamond substrate that is greater than 25 degrees C. during at least a portion of the growth.

4. The method of claim 1 wherein the providing process gasses and forming the plasma to grow both the single crystal diamond and the polycrystalline diamond on the growth surface is performed so that the single crystal growth rate in the direction perpendicular to the top surface of the diamond seed is greater than the polycrystalline growth rate in the direction perpendicular to the top surface of the diamond seed.

5. The method of claim 1 wherein the substrate holder comprises diamond.

6. The method of claim 1 wherein the providing process gasses and forming the plasma to grow both single crystal diamond and polycrystalline diamond on the growth surface comprises establishing a temperature that is in the range of 600 degrees C. to 1400 degrees C. at the growth surface.

7. The method of claim 1 wherein the providing process gasses and forming the plasma to grow both single crystal diamond and polycrystalline diamond on the growth surface results in an ending thickness of the polycrystalline material that is between 20% and 150% of the ending thickness of the single-crystal material.

8. The method of claim 1 further comprising changing process conditions during the growth in order to maintain the desired relative growth rate of the single crystal and polycrystalline material.

9. The method of claim 1 further comprising changing process conditions during the growth in order to maintain the desired growth characteristic of the single crystal material.

10. The method of claim 1 further comprising producing plates of single crystal diamond material by cutting the grown single crystal diamond.

11. The method of claim 1 wherein the thermally mating the diamond seed on the top surface of the substrate holder so as to provide the growth surface of the combined single crystal diamond and polycrystalline diamond substrate comprises thermally mating a plurality of diamond seed on the top surface of the substrate holder so as to provide a plurality of growth surfaces of a plurality of combined single crystal diamond and polycrystalline diamond substrates.

12. The method of claim 1 wherein the desired thickness is greater than or equal to 6.0 mm.

13. The method of claim 1 wherein the desired thickness is greater than or equal to 10.0 mm.

14. The method of claim 1 wherein the desired thickness is greater than or equal to 15.0 mm.

15. The method of claim 1 wherein the performing the growth cycle by providing process gasses and forming the plasma to grow by chemical vapor deposition both single crystal diamond and polycrystalline diamond on the growth surface is performed for a time duration that grows the single crystal diamond to a thickness of greater than or equal to 4.5 mm.

16. The method of claim 1 wherein the bonding material comprises a diamond material.

17. The method of claim 1 wherein a thickness of a single crystal diamond growth in a single, continuous growth cycle exceeds 6 mm.

18. The method of claim 1 wherein a mass of a grown single crystal diamond is greater than two grams.

19. The method of claim 1 further comprising forming the top surface of the substrate holder with a textured finish.

20. A method of growing single crystal diamond assisted by polycrystalline diamond in a single continuous chemical vapor deposition growth cycle, the method comprising:

a) thermally mating a diamond seed directly with a bonding material comprising carbon on a flat top substrate holder so as to provide a growth surface for a combined single crystal diamond and polycrystalline diamond substrate that is unrestricted by the substrate holder where there is a predetermined temperature difference between the diamond seed and the substrate holder during processing which causes a desired relative growth rate of single crystal diamond material in a direction lateral to a top surface of the diamond seed to a growth rate of polycrystalline diamond in a direction perpendicular to the top surface of the diamond seed;

b) performing a growth cycle by providing process gasses and forming a plasma to grow by chemical vapor deposition both single crystal diamond and polycrystalline diamond on the growth surface, where the polycrystalline diamond grown adjacent to the single crystal diamond shields lateral surfaces of the growing single crystal diamond from the plasma and process gases, thereby improving thermal uniformity across the growing single crystal diamond; and c) continuing the growth cycle recited in step b) without interruption to obtain a desired thickness while continuously maintaining the thermal mating of the single crystal diamond seed on the top surface of the substrate holder, thereby preventing growth lines and defects formed between growth cycles, while allowing lateral growth with respect to a growth face of the diamond seed that is unrestricted by the substrate holder in a single process run.

21. The method of claim 20 wherein the desired relative growth rate of the single crystal material to the polycrystalline material is greater than one half.

22. The method of claim 20 wherein providing the process gasses and forming the plasma are provided so that there is a temperature difference over the growth surface that is greater than 25 degrees C. during at least a portion of the growth.

23. The method of claim 20 further comprising attaching the diamond seed to the holder with a thermally conductive material.

24. The method of claim 20 further comprising selecting a bonding material comprising carbon to attach the diamond seed to the holder so that there is a desired temperature difference between the diamond seed and the polycrystalline material during growth.

25. The method of claim 20 wherein the thermally mating the diamond seed on the top surface of a substrate holder is performed such that a temperature difference exists between the diamond seed and the polycrystalline material during growth.

26. The method of claim 20 wherein the providing process gasses and forming the plasma to grow both single crystal diamond and polycrystalline diamond on the growth surface results in an ending thickness of the polycrystalline material that is between 20% and 150% of the ending thickness of the single-crystal material.

27. The method of claim 20 further comprising changing process conditions during the growth in order to maintain the desired relative growth rate of the single crystal and polycrystalline material.

28. The method of claim 20 further comprising changing process conditions during the growth in order to maintain the desired growth characteristic of the single crystal material.

29. The method of claim 20 wherein the thermally mating the diamond seed on the top surface of the substrate holder so as to provide the growth surface of the combined single crystal diamond and polycrystalline diamond substrate comprises thermally mating a plurality of diamond seed on the top surface of the substrate holder so as to provide a plurality of growth surfaces of a plurality of combined single crystal diamond and polycrystalline diamond substrates.

30. The method of claim 20 wherein the bonding material comprises a diamond material.

31. The method of claim 20 wherein a thickness of a single crystal diamond growth in a single, continuous growth cycle exceeds 6 mm.

32. The method of claim 20 wherein a mass of a grown single crystal diamond is greater than two grams.

33. A method of growing single crystal diamond assisted by polycrystalline diamond in a single continuous chemical vapor deposition growth cycle, the method comprising:
 a) thermally mating single crystal diamond seeds on a flat top substrate holder with a bonding material comprising nitride material so as to provide a growth surface of a combined single crystal diamond and polycrystalline diamond substrate that is unrestricted by the substrate holder where there is a predetermined temperature difference determined at least in part by the bonding material comprising nitride material between the single crystal diamond seed and the substrate holder during processing which causes a single crystal diamond growth rate in a direction perpendicular to a top surface of the single crystal diamond seed to be different from a polycrystalline growth rate in a direction perpendicular to the top surface of the single crystal diamond seed by a desired amount;
 b) providing process gasses and forming a plasma to grow both single crystal diamond and polycrystalline diamond on the growth surface, where the polycrystalline diamond grown adjacent to the single crystal diamond shields lateral surfaces of the growing single crystal diamond from the plasma and process gases, thereby improving thermal uniformity across the growing single crystal diamond during the single chemical vapor deposition growth; and
 c) terminating the chemical vapor deposition growth of the single crystal diamond without multiple growth cycles, thereby forming a diamond without growth lines and defects associated with multiple growth cycles, while allowing lateral growth with respect to a growth face of the diamond seed that is unrestricted by the substrate holder in a single process run.

34. The method of claim 33 wherein a thickness of a single crystal diamond growth in a single, continuous growth cycle exceeds 6 mm.

35. The method of claim 33 wherein a mass of a grown single crystal diamond is greater than two grams.

36. The method of claim 33 wherein the desired relative growth rate of the single crystal material to the polycrystalline material is greater than one half.

37. The method of claim 33 wherein providing the process gasses and forming the plasma are provided so that there is a temperature difference over the growth surface that is greater than 25 degrees C. during at least a portion of the growth.

38. The method of claim 33 further comprising forming the top surface of the substrate holder with a textured finish.

39. The method of claim 33 further comprising attaching the diamond seed to the holder with a thermally conductive material.

40. The method of claim 33 wherein the thermally mating the diamond seed on the top surface of a substrate holder is performed such that a temperature difference exists between the diamond seed and the polycrystalline material during growth.

41. The method of claim 33 wherein the providing process gasses and forming the plasma to grow both single crystal diamond and polycrystalline diamond on the growth surface results in an ending thickness of the polycrystalline material that is between 20% and 150% of the ending thickness of the single-crystal material.

42. The method of claim 33 further comprising changing process conditions during the growth in order to maintain the desired relative growth rate of the single crystal and polycrystalline material.

43. The method of claim 33 further comprising changing process conditions during the growth in order to maintain the desired growth characteristic of the single crystal material.

44. The method of claim 33 wherein the thermally mating the diamond seed on the top surface of the substrate holder so as to provide the growth surface of the combined single crystal diamond and polycrystalline diamond substrate comprises thermally mating a plurality of diamond seed on the top surface of the substrate holder so as to provide a plurality of growth surfaces of a plurality of combined single crystal diamond and polycrystalline diamond substrates.

45. A method of growing single crystal diamond assisted by polycrystalline diamond in a single continuous chemical vapor deposition growth cycle, the method comprising:
   a) thermally mating single crystal diamond seeds on a flat top substrate holder with a bonding material comprising metal oxide so as to provide a growth surface of a combined single crystal diamond and polycrystalline diamond substrate that is unrestricted by the substrate holder where there is a predetermined temperature difference determined at least in part by the bonding material comprising metal oxide between the single crystal diamond seed and the substrate holder during processing which causes a single crystal diamond growth rate in a direction perpendicular to a top surface of the single crystal diamond seed to be different from a polycrystalline growth rate in a direction perpendicular to the top surface of the single crystal diamond seed by a desired amount;
   b) providing process gasses and forming a plasma to grow both single crystal diamond and polycrystalline diamond on the growth surface, where the polycrystalline diamond grown adjacent to the single crystal diamond shields lateral surfaces of the growing single crystal diamond from the plasma and process gases, thereby improving thermal uniformity across the growing single crystal diamond during the single chemical vapor deposition growth; and
   c) terminating the chemical vapor deposition growth of the single crystal diamond without multiple growth cycles, thereby forming a diamond without growth lines and defects associated with multiple growth cycles, while allowing lateral growth with respect to a growth face of the diamond seed that is unrestricted by the substrate holder in a single process run.

46. The method of claim 45, wherein a thickness of a single crystal diamond growth in a single, continuous growth cycle exceeds 6 mm.

47. The method of claim 45, wherein a mass of a grown single crystal diamond is greater than two grams.

48. The method of claim 45 wherein the desired relative growth rate of the single crystal material to the polycrystalline material is greater than one half.

49. The method of claim 45 wherein providing the process gasses and forming the plasma are provided so that there is a temperature difference over the growth surface that is greater than 25 degrees C. during at least a portion of the growth.

50. The method of claim 45 further comprising forming the top surface of the substrate holder with a textured finish.

51. The method of claim 45 further comprising attaching the diamond seed to the holder with a thermally conductive material.

52. The method of claim 45 wherein the thermally mating the diamond seed on the top surface of a substrate holder is performed such that a temperature difference exists between the diamond seed and the polycrystalline material during growth.

53. The method of claim 45 wherein the providing process gasses and forming the plasma to grow both single crystal diamond and polycrystalline diamond on the growth surface results in an ending thickness of the polycrystalline material that is between 20% and 150% of the ending thickness of the single-crystal material.

54. The method of claim 45 further comprising changing process conditions during the growth in order to maintain the desired relative growth rate of the single crystal and polycrystalline material.

55. The method of claim 45 further comprising changing process conditions during the growth in order to maintain the desired growth characteristic of the single crystal material.

56. The method of claim 45 wherein the thermally mating the diamond seed on the top surface of the substrate holder so as to provide the growth surface of the combined single crystal diamond and polycrystalline diamond substrate comprises thermally mating a plurality of diamond seed on the top surface of the substrate holder so as to provide a plurality of growth surfaces of a plurality of combined single crystal diamond and polycrystalline diamond substrates.

* * * * *